United States Patent
Davison (12)

(10) Patent No.: US 6,304,601 B1
(45) Date of Patent: Oct. 16, 2001

(54) DATA COMPRESSION APPARATUS

(75) Inventor: Allan Joseph Davison, Farnham (GB)

(73) Assignee: Canon Research Centre Europe Ltd. (GB)

( * ) Notice: Subject to any disclaimer, the term of this patent is extended or adjusted under 35 U.S.C. 154(b) by 0 days.

(21) Appl. No.: 09/043,584

(22) PCT Filed: Sep. 27, 1996

(86) PCT No.: PCT/GB96/02389

§ 371 Date: Jun. 18, 1998

§ 102(e) Date: Jun. 18, 1998

(87) PCT Pub. No.: WO97/12445

PCT Pub. Date: Apr. 3, 1997

(30) Foreign Application Priority Data

Sep. 27, 1995 (GB) .................................................. 9519735

(51) Int. Cl.[7] .................................................. H03M 7/42
(52) U.S. Cl. .............................. 375/240; 341/51; 341/87; 341/106; 707/101
(58) Field of Search .................................... 375/240, 241, 375/242; 341/51, 78, 87, 106; 707/9, 101; 708/208

(56) References Cited

U.S. PATENT DOCUMENTS

| | | | |
|---|---|---|---|
| 4,511,758 | * | 4/1985 | Konishi et al. ...................... 175/2 B |
| 4,955,066 | * | 9/1990 | Notenboom .......................... 382/240 |
| 5,023,610 | * | 6/1991 | Rubow et al. ........................ 341/51 |
| 5,111,398 | * | 5/1992 | Nunberg et al. ........................ 704/9 |
| 5,151,697 | * | 9/1992 | Bunton .................................. 341/51 |
| 5,224,038 | * | 6/1993 | Bespalko ............................... 707/531 |
| 5,353,024 | * | 10/1994 | Graybill ................................ 341/51 |
| 5,410,671 | * | 4/1995 | Elgamal et al. ....................... 341/51 |
| 5,561,421 | * | 10/1996 | Smith et al. ........................... 341/51 |
| 5,771,010 | * | 6/1998 | Masenas ............................... 341/51 |
| 5,890,103 | * | 3/1999 | Carus ................................... 704/9 |
| 5,933,104 | * | 8/1999 | Kimura ................................. 341/87 |

FOREIGN PATENT DOCUMENTS

0199035 * 10/1986 (EP) .
WO 88/09586 * 12/1988 (WO) .

OTHER PUBLICATIONS

White: "Printed English Compression by Dictionary Encoding", IEEE, vol. 55, No. 3, Mar. 1967, pp. 390–396.*

* cited by examiner

Primary Examiner—Young T. Tse
(74) Attorney, Agent, or Firm—Fitzpatrick, Cella, Harper & Scinto

(57) ABSTRACT

A method for compressing text, comprising the steps of splitting a main character string into component strings, and counting the frequency of occurrence of each component string in the main character string and ordering the component strings in their frequency of occurrence. The method also comprises a step of allocating to each component string a token value representative of the component string and determined by the frequency of occurrence of the component string, storing the token value so allocated as a token table in which tokens are associated with component strings, and allocating to each component string in the main character string the token value for that component string from the token table to generate a sequence of token values representing the main character string in a compressed format.

18 Claims, 9 Drawing Sheets

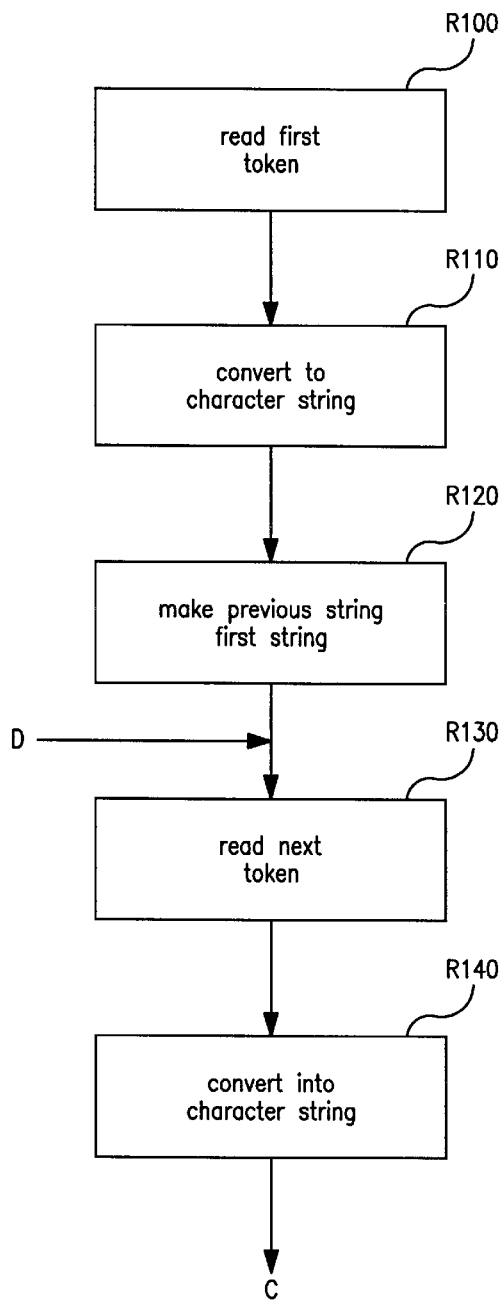
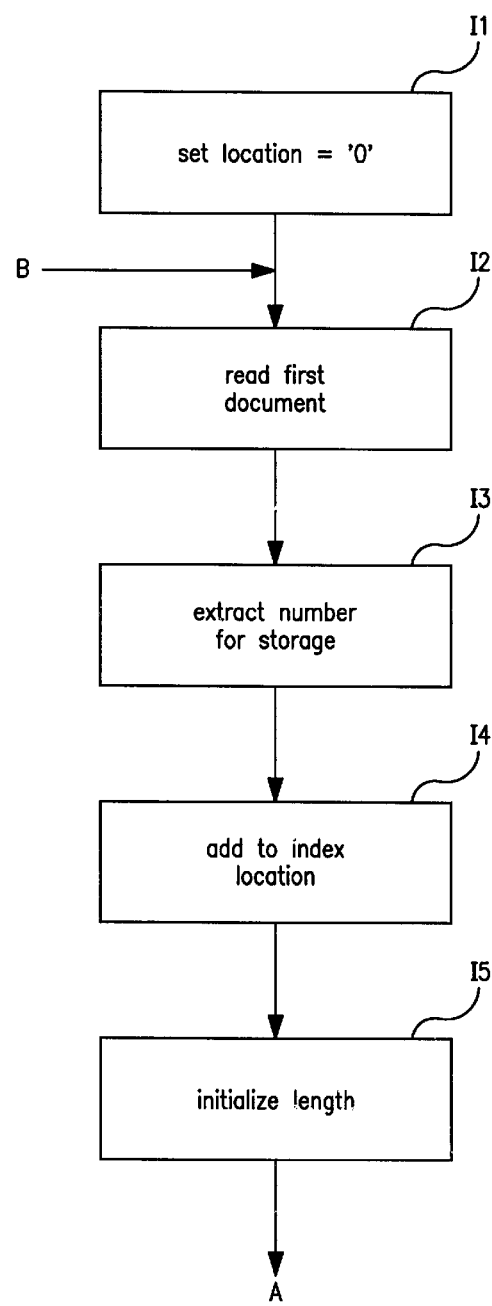
FIG. 5
FIG. 7

| PATENT NO | START | LENGTH |
|-----------|-------|--------|
| PATENT NO | START | LENGTH |
| PATENT NO | START | |
| | | |
| | | |
| ⋮ | ⋮ | ⋮ |
| | | |
| PATENT NO | START | LENGTH |

DATA COMPRESSION APPARATUS

FIELD OF THE INVENTION

The present invention concerns the handling of data and in particular the handling and compression of text data.

BACKGROUND OF THE INVENTION

Every year the amount of data electronically stored and then accessed by users grows substantially. One example of this has been driven by the increased viability of high-density optical storage discs. There are now many organisations which send out data in the form of optical discs at regular intervals. The data can either be data which has only recently become available to the general public, such as newly published or granted patent specifications, or already existing publications which have been collated. It will be appreciated that whilst modern technology allows a user to scan rapidly through the contents of an optical disc, problems arise when it is required to scan through the contents of a large number of such discs. An acute example as to how such a problem can arise is when users have optical disc databases of patent information which is updated on a monthly basis in response to the publication of pending or granted patent specifications. Whilst it may well be advantageous for a user to scan through one or more discs for relevant information, any attempt to extract data over a greater period of time becomes labour intensive. A solution to this problem is to down-load the text stored in a recently received optical disc and combine this text with the previously received text in a single large database. It will be appreciated than when a single optical disc can hold the contents of 10,000 substantial documents such as patent specifications a single database holding all this information must have a very substantial capacity. It has accordingly become quite common to store data, and in particular textual information, in compressed form. Normally text is stored on the optical disc in the widely accessible ASCII format. Text compression algorithms are known and can reduce the storage requirements for large quantities of text originally stored in ASCII format by as much as 70%. Some compression algorithms are known as "lossy" as they cause the problem that the actual format and layout of the text is lost on decompression. Other algorithms maintain the format of the text. However both types of known compression algorithm have the drawback that it is very difficult to index nested sections within the complete text and decompress these sections alone. It can thus be seen that any user of a database has to meet two requirements which at present conflict. Either the data can be stored in uncompressed form so that it can be readily indexed but will take up a substantial amount of expensive storage capacity, or the data can be compressed so as to reduce the required storage capacity but with the attendant problem that the data is then difficult to access and extract.

SUMMARY OF THE INVENTION

Accordingly the present invention is concerned with providing a method of compressing textual data which provides both substantial compression and which allows the compressed data to be indexed in such a manner that sections of data can be readily accessed and decompressed by a user. The present invention is also concerned with providing a signal format which enables textual data to be rapidly and efficiently transmitted from one location to another.

In accordance with a first aspect of the invention there is provided apparatus for compressing text comprising:

means for splitting a main character string into component strings wherein the splitting means in operation splits the main character string in two stages; a first stage in which the main character string is split into strings of multiple spaces which represent part of the final component strings and strings which include single spaces, words and punctuation, and a second stage in which the non-multiple space strings are split in accordance with a splitting algorithm into words, punctuation and single spaces which represent the remainder of the component strings;

means for counting the frequency of occurrence of each component string in the main character string and ordering the component strings in their frequency of occurrence;

means for allocating to each component string apart from single spaces a token value representative of the component string and determined by the frequency of occurrence of the component string;

means for storing the token values so allocated as a token table;

means for allocating to each component string in the main character string the token value for that component string from the token table to generate a sequence of token values representing the main character string in a compressed format; and means for storing the sequence of token values, and wherein said splitting algorithm enables the original document to be reconstituted faithfully including the single spaces which have effectively been discarded.

In accordance with a second aspect of the invention there is provided a method of compressing text comprising:

splitting a main character string into component strings wherein the splitting operation splits the main character string in two stages; a first stage in which the main character string is split into strings of multiple spaces which represent part of the final component strings and strings which include single spaces, words and punctuation, and a second stage in which the non-multiple space strings are split in accordance with a splitting algorithm into words, punctuation and single spaces which represent the remainder of the component strings;

counting the frequency of occurrence of each component string in the main character string and ordering the component strings in their frequency of occurrence;

allocating to each component string apart from single spaces a token value representative of the component string and determined by the frequency of occurrence of the component string;

allocating to each component string in the main character string the token value for that component string from the token table to generate a sequence of token values representing the main character string in a compressed format; and storing the sequence of token values, and wherein said splitting algorithm enables the original document to be reconstituted faithfully including the single spaces which have effectively been discarded.

Other aspects of the invention include apparatus and a method for decompressing text; apparatus for both compressing and decompressing text; compressed text in the form of a signal which can be either optical or electronic; and a storage medium on which is stored text compressed in accordance with the present invention.

It will, of course, be understood that optical discs are only one storage medium and that many other storage mediums are available for storing both uncompressed and compressed data. Additionally compression techniques can be advantageous when data has to be transmitted either over fixed lines which may be optical fibres or via radio.

BRIEF DESCRIPTION OF THE DRAWINGS

In order that the present invention may be more readily understood, embodiments thereof will now be described by way of example and with reference to the accompanying drawings in which:

FIG. 5 is a flow diagram which is supplementary to FIG. 4;

FIG. 7 is a flow diagram showing how sections of compressed text can be indexed to generate a first level index file;

DETAILED DESCRIPTION OF THE PREFERRED EMBODIMENT

Figure 1:
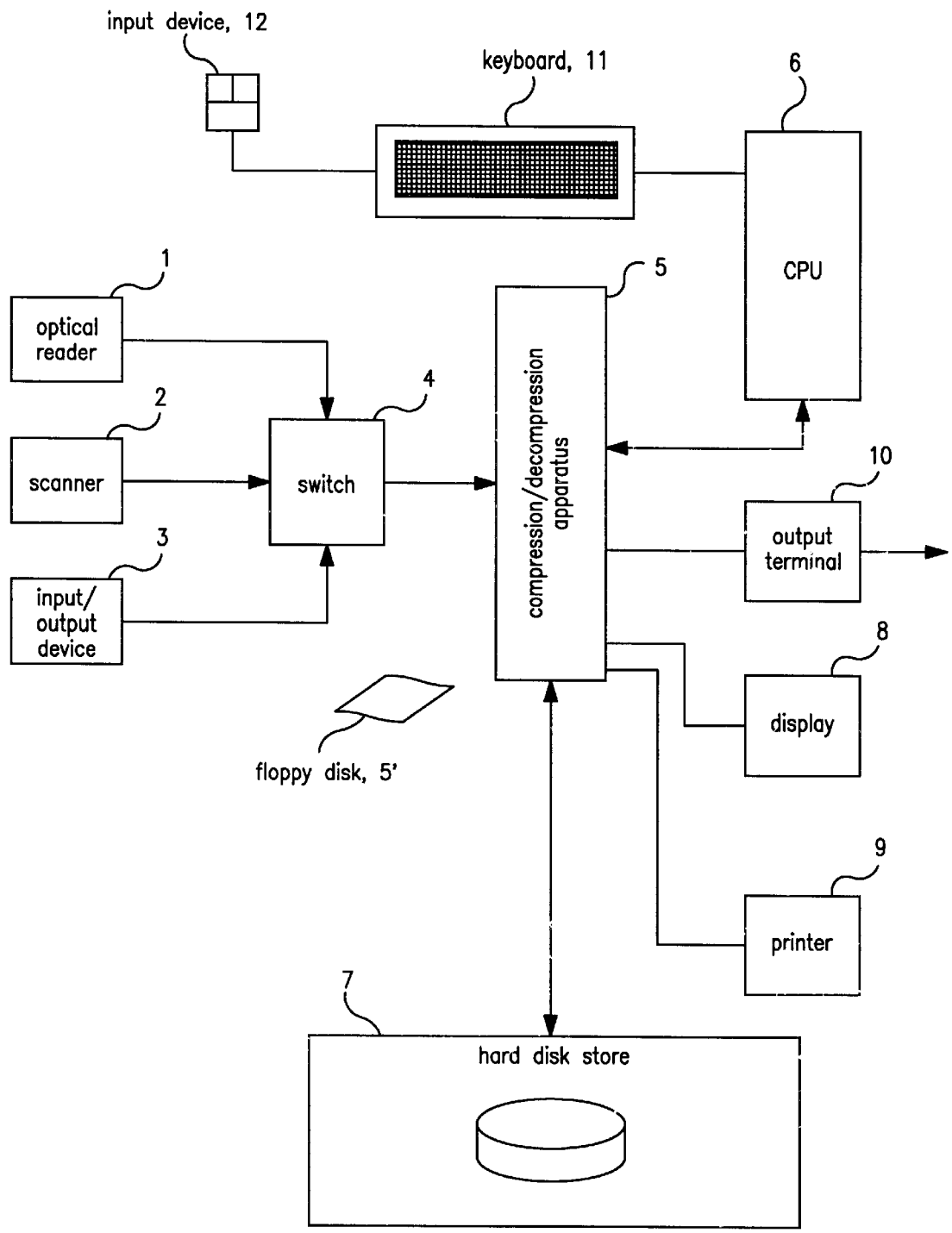
FIG. 1 is a block diagram of one embodiment of a database system according to the present invention.

Referring now to FIG. 1 of the drawings, this shows data compression apparatus comprising an optical reader 1 for reading text stored in ASCII form on optical discs. The apparatus also includes a scanner 2 for scanning sheets of text and converting the scanned text into ASCII format together with an ISDN interface by means of which data can be received over the ISDN either in ASCII format or in an already compressed format. A switch 4 enables an operator to select between the outputs of the devices 1, 2 and 3 so that a selected output can be applied to a compression/decompression apparatus 5 which is under the control of a central processor unit 6. Associated with the compression/decompression apparatus 5 is a hard disc store 7 by means of which the compressed data and associated indices can be stored and from which the compressed data can be read for subsequent decompression. The decompressed data can be read on a CRT display 8 associated with the CPU 6 or printed on a suitable printer 9 or transmitted via an ISDN output terminal 10 to a remote destination. It will, of course, be appreciated that the compressed data can be read from the hard disc in which it is stored and transmitted in its compressed format to a distant location should the target location have its own decompression apparatus which is compatible with the compression algorithm carried out by the apparatus being described. Naturally the time required to transmit the compressed data is shorter time than the time required to transmit the data uncompressed with a corresponding saving in transmission expense. Finally, the CPU 6 is associated with a keyboard 11 and an input device, such as a mouse or rollerball 12, to enable the apparatus as a whole to be controlled by an operator.

In the following discussion it will be assumed that the apparatus shown in FIG. 1 is being used to read optical discs containing the texts of patent specifications, to compress the text in accordance with an algorithm and to store the compressed text in the hard discs 7 and 8. It will, however, be appreciated that this particular use is given by way of example only and that the apparatus is equally applicable to all kinds of text and that the compression techniques involved are independent of the nature of the text.

In order to carry out the reading and compression operation an optical disc is placed in the optical disc reader 1, the switch 4 is appropriately set by the operator and the text stored on the optical disc supplied to the compression apparatus in ASCII format. It will also be appreciated that the actual format with which the uncompressed data is stored is not relevant to the actual appreciation or operation of the present invention. An important feature of the compression apparatus is it is capable of recognising and sorting character strings in one format which is not necessarily limited to ASCII format, and compressing the text by a compression algorithm.

In the first stage of the text compression text read from the optical disc is split into character strings by the application of a special splitting algorithm which will be described in greater detail hereinafter. As the sum of these character strings constitutes the main character string the strings generated by the splitting will be referred to hereinafter as component strings. The result of this splitting algorithm is to produce a table which contains a list of every single component string identified by the splitting algorithm. Furthermore, during the generation of this table, the number of occurrences of each of the component strings identified by the compression algorithm is counted. Thus not only does the table include every identified component string but it also includes the number of times that particular component string occurred. The table is then organised by the compression algorithm so that the most frequently occurring component string is placed at the top of the table and the remaining component strings are ordered in descending order of their number of occurrences. The result of this operation is shown in Table 1 attached to this specification. It will be seen that this table is in the form of paired columns in which the left-hand column of a pair shows the number of occurrences of a component string in a textual database which has been read, and the right-hand column in each pair shows the extracted component string. Thus the first entry in this table is the component string which occurred with the greatest frequency and the last entry in the table would normally show the component string which occurred with the least frequency. In the interests of simplicity, only those component strings which occurred more than 10,000 times in the original database have been shown.

The next step in the compression algorithm is to allocate to each of the component strings a token which represents that specific component string. The present invention allocates tokens of a single byte to the first 251 most frequent component strings. By using two byte tokens and three byte tokens for component strings which occur with lesser and lesser frequency it will be appreciated that every possible component string which can be extracted from a text can be given its own token. It will be appreciated also that in certain instances the token may actually involve a greater use of storage capacity than the ASCII character string which has been tokenised. Nevertheless, by allocating the tokens in the manner described above, the actual storage requirement is substantially reduced because many component strings which in ASCII would occupy several bytes are replaced by a single byte. It is also feasible to identify the most frequently occurring component strings with a lesser number of bits. In practice it has been found that the additional complexity of this procedure is not matched by a worthwhile increase in compression.

In Table 1 it will be seen that, not surprisingly, the most frequently occurring component string, that is the first entry on the table, is a single space. This occurred no less than 4,069,748 times in the sample database. The next most frequent component string was the word "the" and the third a full stop. Those component strings in the table which are represented by inverted commas with nothing between the inverted commas are multiple spaces with the number of spaces depending on the spacing between the inverted commas.

The second stage of the compression process is to read the main character string in its uncompressed form again, to separate out the component strings as in the first stage and to allocate in sequence to each separated component string the appropriate token from the token table and then to store the string of tokens so generated in the hard disc area 7 as the compressed text. It will be appreciated that the compression algorithm with which the present invention is concerned is not applicable to non-textual data.

Once the tokenised text has been stored it is then possible to reconstitute the original text by successively reading the tokens, matching a token with a component string in the token table so as to reconstitute the original component string and outputting the reconstituted components strings, that is the main character string, either via the CRT display 8 or the printer 9. Alternatively, of course, the reconstituted component strings could be transmitted to a target destination via the ISDN terminal 11.

The foregoing has provided a general description of the procedures carried out in compressing and reconstituting text.

The overall algorithms for generating the token table and for tokenising the text in accordance with the table will now be described in greater detail.

It will be appreciated that the original text as represented by the main character string consists of actual words, spaces in combinations ranging from 1 to many, numbers, and punctuation such as commas, full stops, colons, inverted commas and the like. As the present embodiment is concerned with maintaining the original format of the written or printed text, this format can be only be maintained when it is reconstituted by inserting the appropriate spaces between actual words and words and punctuation. On the other hand, as seen from Table 1, a substantial part of the character strings extracted from the original text comprises single spaces. The overall compression algorithm used in the present invention recognises this fact and actually discards all single spaces yet still retains the ability to reconstitute the text with all such appropriate spaces in their correct places. This is achieved by the splitting algorithms used to tokenise the text.

Before describing the splitting algorithms in detail, the following is a generic example of string splitting:

"are read by the printer control system (7, 12, 14) and used to reconfigure its . . . "

It will be appreciated that the above sentence can actually be split in a number of different ways. The way selected in the present embodiment splits the text into what can be described as self-standing units, these units including complete words, numbers and punctuation, rather than on the basis of individual units such as single characters. The conditions under which the individual strings which go to make up the whole are split are defined as "string boundaries". It is evident that the most basic set of strings into which this sentence can be split would be with added inverted commas to separate the individual strings and "space" represented by "u", "are" "u" "read" "u" "by" "u" "the" "u" "printer" "u" "("7" "," "u" "12" "," "u" and so on.

In the subsequent tokenising procedure, if the text layout were to be preserved on decompression in known systems, the spaces would have to be tokenised and stored. As already discussed the number of single spaces in text means that the tokenised single space strings will take up a substantial portion of the compressed data.

However merely discarding the single spaces poses a substantial problem as how the text can be reconstituted in a loss-less manner. Thus whilst a decompression algorithm could be used with the assumption that separate word strings will always be separated by a space decisions are much more difficult to make with regard to words followed or preceded by punctuation marks, or by combinations of punctuation marks and single spaces.

In the embodiment of the invention being described this problem is overcome by using a special two stage splitting algorithm to generate the token table and by using the converse of this algorithm in the decompression process.

The generation of a token table will now be described in greater detail and with reference to the flow diagram shown in FIG. 2 of the accompanying drawings.

In this flow diagram S1 represents the input of data in the form of a main character string from, for example, the optical CD1 reader of FIG. 1. At S2 a first splitting algorithm is applied to the input main string. This algorithm splits the main string into strings which represent two or more spaces or strings which are a combination of words, punctuation and single spaces. S3 is a decision box where the question is asked "IS IT A MULTIPLE SPACE STRING?". The "YES" branch goes to S4 where the number of spaces in the string is counted, these multiple space strings being component strings eventually to be tokenised and stored in the token table.

The "No" branch of S3 is sent to S5 where a second split algorithm is implemented which further splits the non-multiple space strings into the remaining component strings. This algorithm is of considerable importance and will be described in detail hereinafter. The individual component strings so generated are counted and stored at S6. S7 is merely a loop to ensure that the splitting algorithms are continued until the main character string has been completely read. At S8 the component strings generated and stored at S4 and S6 are sorted on the basis of the number of occurrences to produce a table of the kind shown in Table 1, and finally at S9 a token table is generated with the most frequently occurring strings being allocated individual tokens in the form of single bytes, and the remaining strings allocated either two or three bytes also in order to decreasing frequency of appearance.

One of the problems with reconstituting text from which single spaces has been discarded is whilst that it is easy to appreciate that between individual words there will be a single space, as plural spaces have been tokenised and not discarded, there is an immediate problem when there is intervening punctuation. This is because there is no general rule which can state whether a punctuation mark is preceded by, followed by or not associated with a single space. A basic example of this problem is constituted by the following five component strings:

(1) "word""u""word"
(2) "word""u.""word"
(3) "word""u.""u""word"
(4) "word".u""word"
(5) "word"".""word".

Again the inverted commas are merely to define the individual steps.

In these examples the full stop is used to represent any punctuation mark. For instance a bracket can be considered as a punctuation mark. What constitutes a punctuation mark will depend on the type of text being compressed. For example, in certain instances marks such as / need not be treated specially.

The fundamental problem is, when a single space has been discarded, how can these five examples be distinguished one from the other and correctly reconstituted? It will firstly be appreciated that the first of these examples is the most frequently occurring case. In the embodiment being described because of the difficulty of differentiating between the first of the five examples and the remaining four examples the three combinations of space and punctuation mark are each tokenised so that there are no problems when the text is reconstituted. With regard to the most frequently occurring combination (1), the reconstitution algorithm firstly reads a token to convert it to a string and then makes a decision as to whether or not a single space has to be output before outputting the component string. The rule for doing this is:

(a) If the last character of the previously output component string is not a space or punctuation mark and the first character of the current component string is not a space or a punctuation mark then a space is output followed by the component string or else the component string is output alone. It will be seen that this algorithm deals with the most common example (1).

Accordingly, in order to achieve this at S5 the algorithm splits the non-multiple space strings into the individual component strings indicated in the following table by underlining. The table is exactly the same as (1) to (5) already typed except that under each word and each space or combination of space and full stop there is a single line.
(1) "<u>word</u>""<u>un</u>""<u>word</u>"
(2) "<u>word</u>""<u>u.</u>""<u>word</u>"
(3) "<u>word</u>""<u>u.u</u>""<u>word</u>"
(4) "<u>word</u>"".<u>u</u>""<u>word</u>"
(5) "<u>word</u>"".""<u>word</u>".

At this stage of the splitting algorithm all of the component strings so generated are tokenised and counted although it is not absolutely necessary to count the singe space tokens as these will eventually be discarded.

As already described, the outcome of this first stage is the generation of a token table which is then used to tokenise the main character string.

Figure 3:
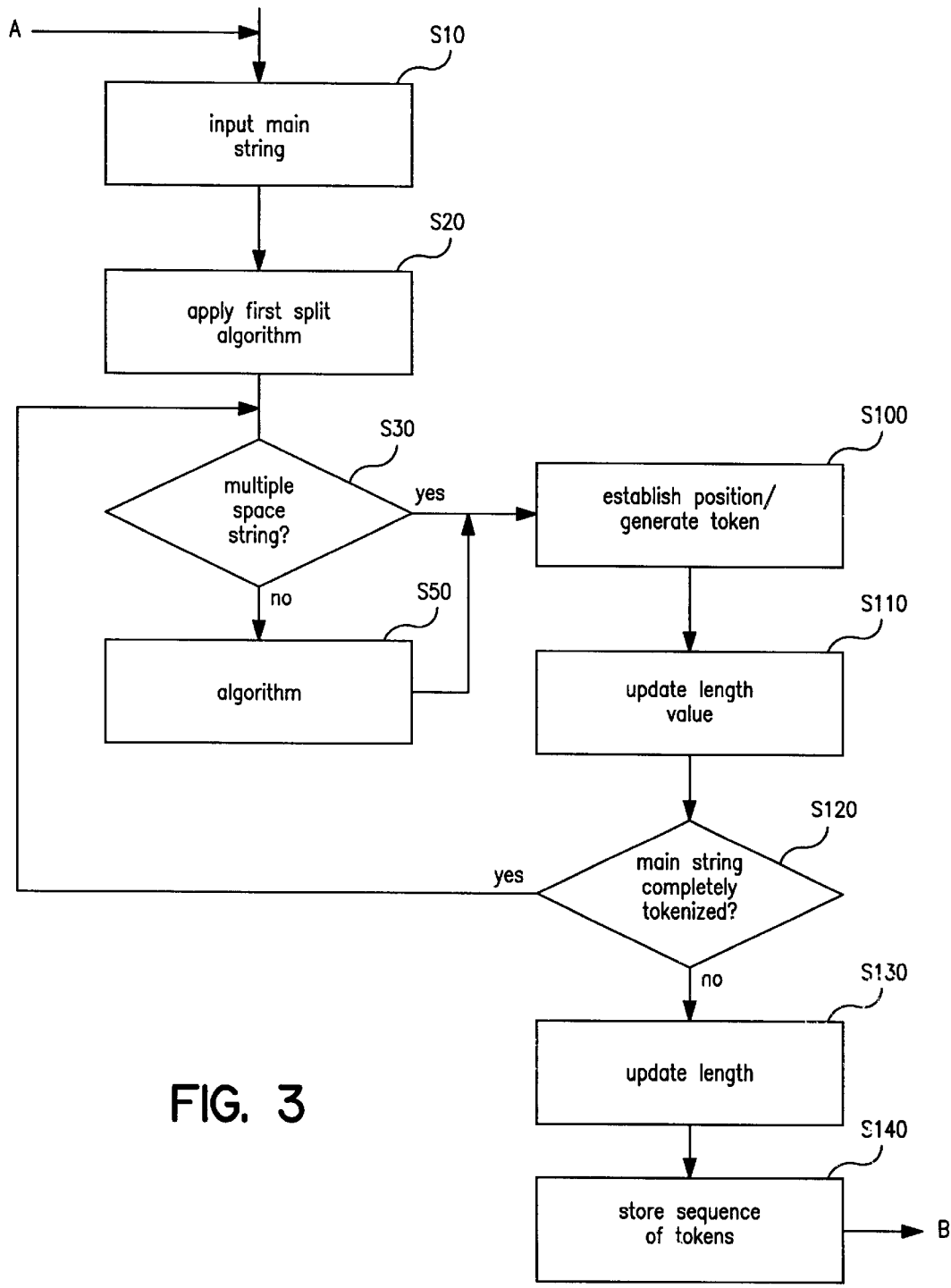
FIG. 3 is a flow diagram of a second stage of the compression algorithm.

This procedure is shown in the flow diagram of FIG. 3. In this flow diagram the inputs A and B, which relate to indexing of the compressed text, will be described hereinafter as they are not fundamental to the actual process of compression though they are of importance in that the compressed text can be readily indexed.

Figure 2:
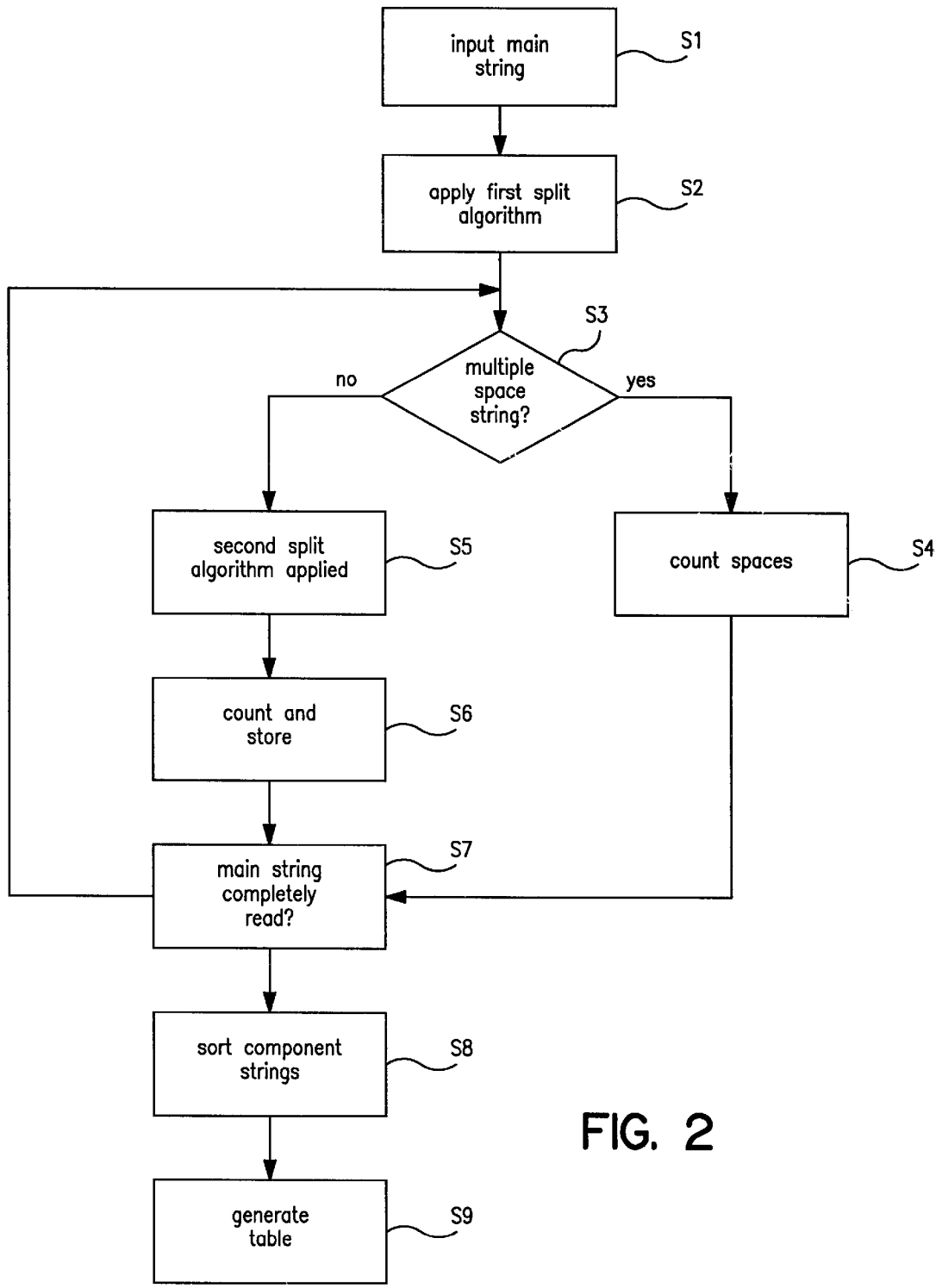
FIG. 2 is a flow diagram showing a first stage of a compression algorithm.

In the FIG. 3 flow diagram S10 is similar to S1 of FIG. 2 in that it represents the input of the uncompressed main character string from, for example, the optical disc reader of FIG. 1.

Additionally in this flow diagram S20, S30 and S50 are identical to stages S2, S3 and S5 of the flow diagram of FIG. 2 with one change in S5. In this second stage of the splitting the single space component strings are discarded. In this second stage the output component strings of S30 and S50 are supplied to S100 where the position of each string in the token table is established and the position used to generate a token value representative of that position, which value is output to S110. At S110 the value of the token is used to update a length value indicative of the current length of the tokenised version of the document. S120 provides a loop to ensure that all the main character string is tokenised, S130 provides a final update of the length of the tokenised main string for use in indexing, this length being added to the index, which will be described later, as indicated by the arrow B. Thus this final value will indicate the actual length of the compressed document. Finally, at S140 the sequence of tokens is stored in the hard disc storage 7 for subsequent usage. The basic algorithm for decompressing the stored tokens to generate the original text will now be described with reference to the flow diagram of FIG. 4.

In this flow diagram the first token stored in the hard disc store 7 is read by the apparatus 5 now acting in a decompression mode. It will be appreciated that this token will be one or more bytes. This occurs at stage R10. At R11 the read token is matched with the token table also stored in hard disc store 7 to generate a component string. At R11 a decision is taken as to whether or not the end of a previous component string is punctuation or a space character. If the answer to this question is "YES", R13 outputs the new word which was generated by matching the token with the token table. If the answer at R11 was "NO", then R14 makes the decision "IS THE 1ST CHARACTER OF THE NEW STRING SPACE OR PUNCTUATION?". If the answer to this question is "YES" then R13 again outputs the new word which was generated by matching the token with the token table, whilst if the answer is "NO" then R15 outputs "SPACE-NEW WORD". It will be appreciated that all combinations of u (space) and a punctuation mark will have been tokenised and the decision at R11 and R14 accordingly means that a single space had been discarded. R16 is a loop to ensure that all tokens are detokenised. The resultant final output is the original text read from the optical disc reader which can, as already mentioned, be displayed on the CRT display 8, printed on the printer 9 to provide hard copy or transmitted via terminal 10 to a remote destination.

Figure 4:
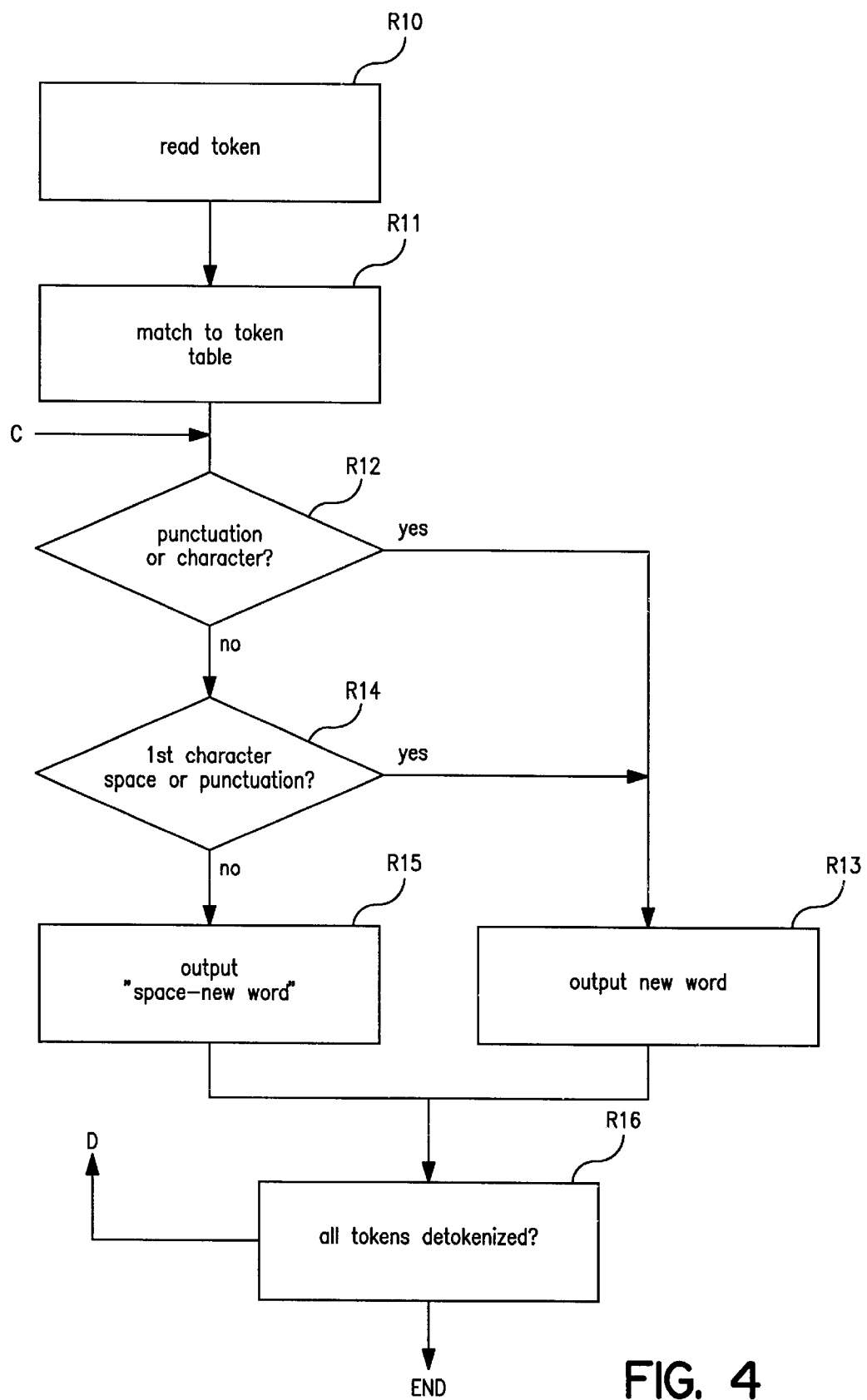
FIG. 4 is a flow diagram showing a decompression algorithm.

FIG. 5 shows an additional flow diagram which complements that of FIG. 4 by providing an initialising procedure and which provides the inputs C and D shown in FIG. 4.

At R100 the first token in the stored tokenised main character string held in the database is read and at R110 this token is converted into a character string by reference to the token table. At R120 the previous string is made the first string and at R130 the next token from the compressed main character string is read and converted at R140 into a character string.

Once a compressed database has been generated and stored it is important for many users that the contents of the database can be searched and specific sections of the database located by a search extracted and decompressed so that they can be read by a user.

The main file generated by the compression algorithms described with regard to FIGS. 2 and 3 is a set of tokens. As already described, some of these tokens will be one byte long, normally a greater number of tokens will be two bytes long and a still further number of tokens will be three bytes long. Naturally the distribution of one, two and three byte tokens will depend on the nature of the text being compressed and the total number of unique component strings. Accordingly, a random access into the main file could land within a multi-byte token which would result in degradation of the text decompressed subsequent to the access.

Figures 6A, 6B:
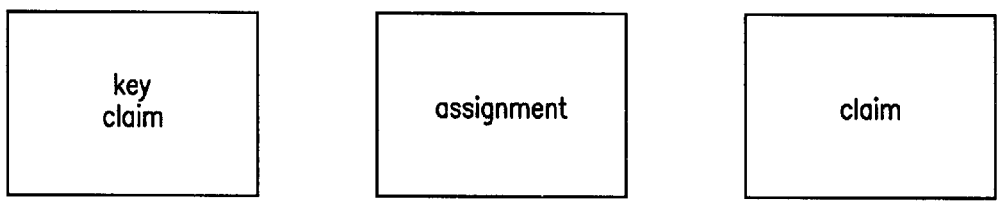
FIGS. 6A and 6B are examples of first and second level index files.

It is accordingly proposed in the embodiment being described that the main file is indexed and that this indexing is carried out during the compression stages. As a particular, but non-limiting, example it will be assumed that the main file is constituted by the texts of a large number of patent specifications. Accordingly, a typical set of fields in the main file by means of which a user might wish to search through the main file would include patent numbers, patent details such as inventors and titles, international classifications into which the patent specification falls, an assignee field, and a key word index. FIG. 6A of the accompanying drawings shows a possible structure for a first level index file and this index file is generated during the compression of the text and is also stored in the hard disc store 7 of FIG. 1. It will, of course, be appreciated that the fields described in this embodiment are purely by way of example and that non-patent subject matter would require a different set of fields.

FIG. 7 of the accompanying drawings is a flow diagram illustrating how the first level index file is generated during compression of the main character string. As can be seen, this flow diagram has an output A corresponding to input A shown in the flow diagram of FIG. 3 of the accompanying drawings, and also an input B corresponding to the output B shown in the same figure. For the purpose of the flow diagram of FIG. 7 it is assumed that it is the first patent stored in the main character string which is being indexed. At I1 the location in the index file is set to 0.

At I2 the first document, in this case a patent specification, is read. At I3 the patent number is extracted for storing in the index file, at I4 the patent number is added to the appropriate index location, and at I5 the length of the document is initialised. It can thus be seen that this procedure results in the index file illustrated in FIG. 6A. The main index shown in FIG. 6A is of limited use as it is important for users of the database to be able to carry out searches based on a number of other fields such as, in the case of patents, applicant, assignee, classification and keywords. In order to achieve this it is necessary to carry out second level indexing in which a second level index file is provided for each of the chosen fields. Examples of such second level index files are shown in FIG. 6B.

Figure 8:
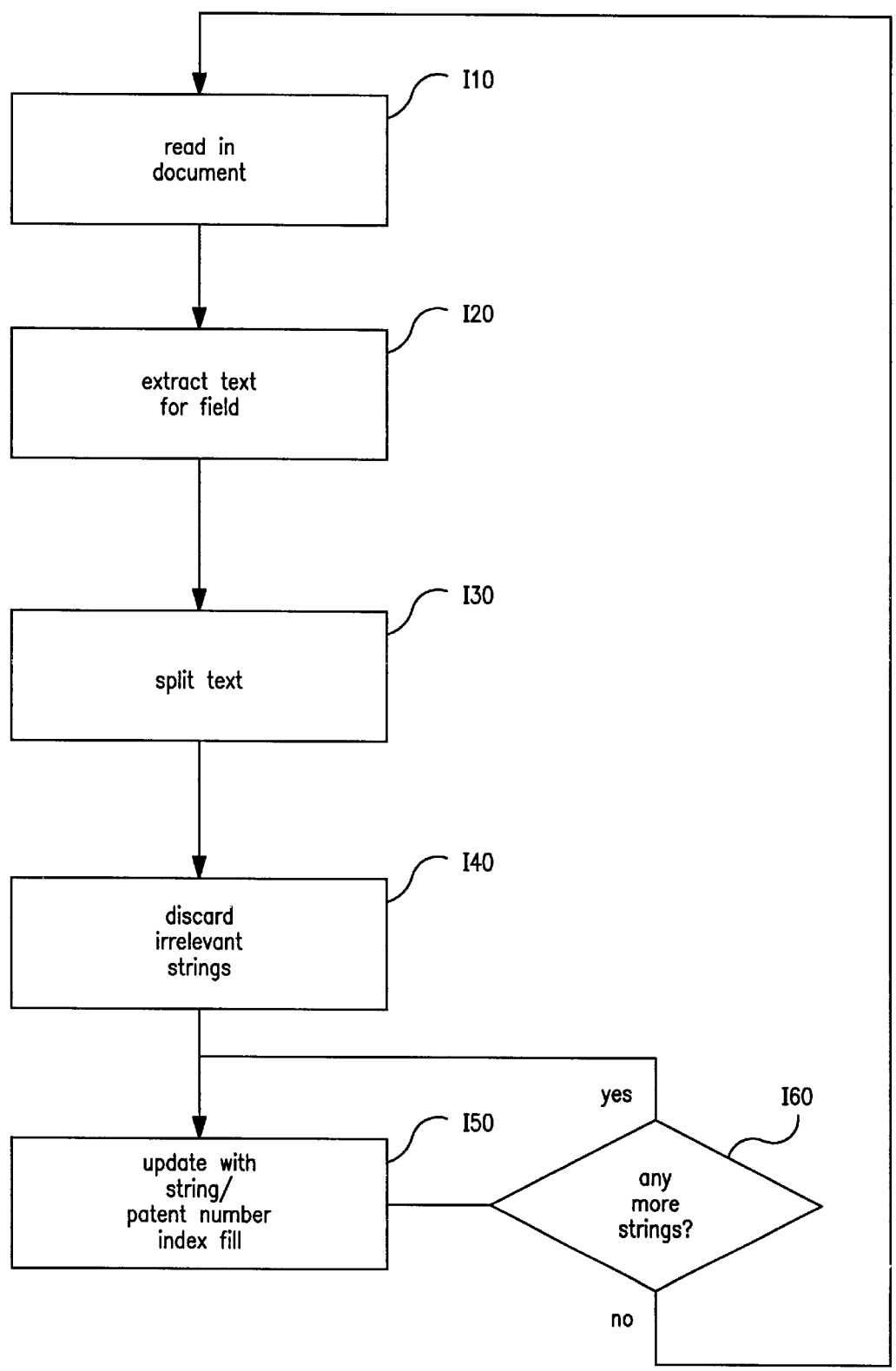
FIG. 8 is a flow diagram showing the generation of a second level index file.

The generation of a second level index file will now be described with reference to the flow diagram of FIG. 8 of the accompanying drawings.

Firstly, at I10 the appropriate text within each field has to be identified. The string representing that field can be demarcated in a number of different ways depending on the nature of the document being compressed. For example, the standard format of a U.S. patent document can be used to identify, for example, the assignee field or the international classification field or fields.

Once the string has been identified a simplified splitting algorithm is carried out at step I20. This algorithm rejects stop words such as "and" and "the" which have no relevance with regard to searching together with all spaces and punctuation marks. The alpha numeric words left after this simplified splitting algorithm are placed at I50 in the appropriate index file and the number of the patent is added uniquely to this file. At I60 a decision is made as to whether or not there are any more strings to be placed in the index file.

Once the first and second level index files have been established it is then a relatively simple matter to carry out searches within the various fields represented by the second level index files.

Figure 9:
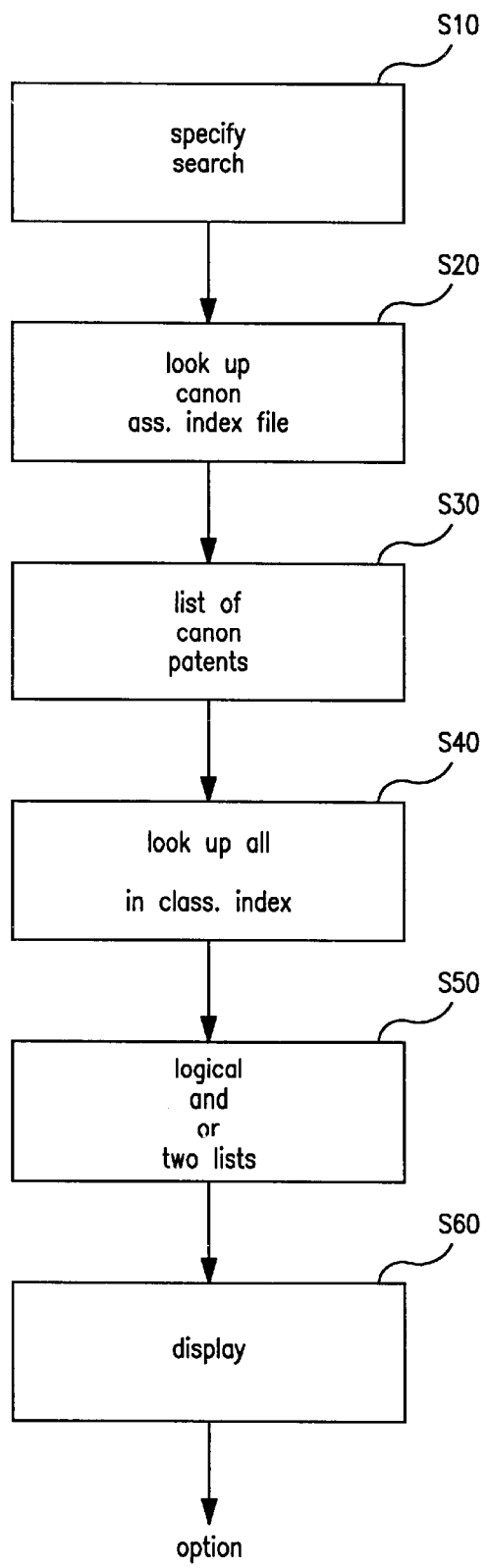
FIG. 9 is a flow chart showing how second level index files are utilised.

The way that a user carries out a search will now be described with reference to the flow diagram of FIG. 9.

At step S10 the user specifies the field or fields that is/are to be searched. For example let one field be all assignees which include the word CANON and another field directed to class 395.

At step S20 the first of these fields, the assignee field, is searched and a list of all patents assigned to Canon is generated at S30.

Next, at S40 the classification index is searched and a list of all patents with that particular classification is generated. At S50 the appropriate logical operation is performed to isolate all those patents which have both Canon as assignees and fall into class 395. A list of these patents is displayed at S60 and the user then has the option to use the main, first level index file to display or print selected ones or all of the patents in the list.

Figure 10:
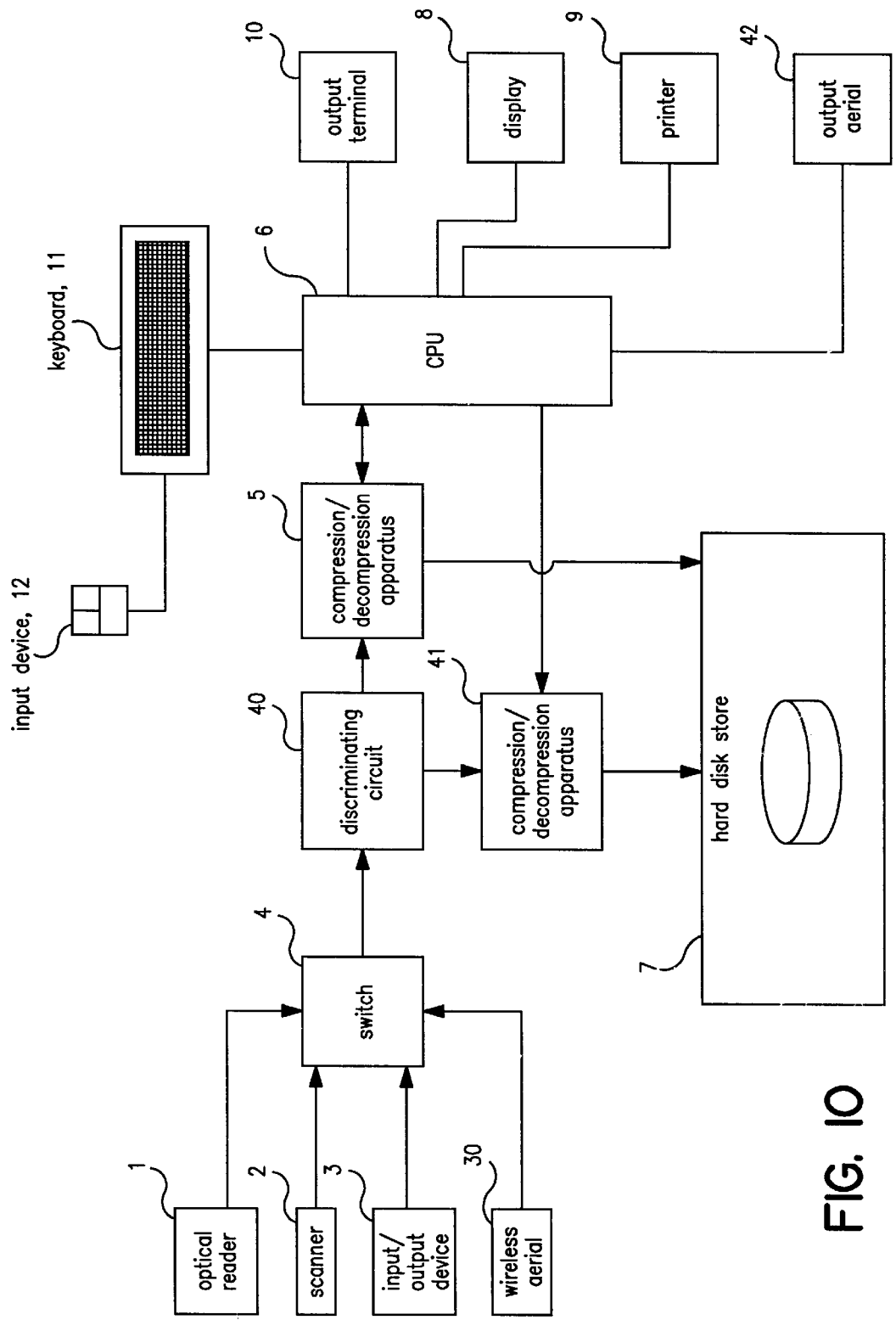
FIG. 10 shows a still further embodiment.

It has already been made clear that the embodiment described herein is limited to the compression and decompression of text. Many documents also contain illustrations and diagrams. It is thus conceivable that the apparatus described with regard to FIGS. 1 and 9 can be used in parallel with known apparatus from compressing picture data so that documents containing both text and drawings can be handled. FIG. 10 of the accompanying drawings shows one such apparatus. In this figure integers which are common to FIG. 1 have been given the same reference numerals. Referring now to FIG. 10, the apparatus in this figure further includes a wireless aerial 30 for receiving data from a remote station and another aerial for transmitting data. The input from aerial is demodulated by appropriate equipment and supplied to switch 4. The output of switch 4 is connected to a circuit 40 controlled by CPU 6 which discriminates between text data and pictorial data and which outputs text data to the data compression/decompression apparatus 5 and pictorial data to compression/decompression apparatus 41 for comparing the pictorial data by an appropriate compression algorithm, the output from apparatus 41 also being stored in hard disc storage area 7. CPU 6 controls the reconstitution of both sets of compressed data and also enables one or the other or both sets to be displayed, printed as hard copy or transmitted via either an output aerial 42 or the ISDN output terminal 10.

It will be appreciated that the apparatus disclosed in FIG. 1 can be a general purpose computer programmed to carry out the compression and decompression algorithms which have been described. The program for such a computer or processor can be stored in various types of transportable computer-readable media such as floppy discs, optical discs, tape streamers and the like. FIG. 1 shows a floppy disc 5' as one example of a computer readable medium.

TABLE 1

| | |
|---|---|
| 4069748 "/007" | 70054 "surface" |
| 2712154 "the" | 70001 " " |
| 1601929 "." | 69749 "has" |
| 1541597 "of" | 69521 "between" |
| 1514852 "," | 68365 "it" |
| 1124689 ":" | 66850 "end" |
| 1120536 "a" | 66674 "into" |
| 950632 "and" | 65440 "degree" |
| 896050 "to" | 63580 "not" |
| 711738 "is" | 63496 "portion" |
| 668923 "in" | 63451 "shown" |
| 457628 ";" | 63261 " " |
| 333940 "The" | 62930 "7" |
| 320719 "for" | 62819 "sup" |
| 308034 "said" | 61846 "through" |
| 300852 "(" | 60374 "about" |
| 267845 "by" | 59153 ":" |

TABLE 1-continued

| | | | |
|---|---|---|---|
| 266667 "with" | 58762 "12" | 30610 "same" | 23090 "compound" |
| 259479 "1" | 58270 " " | 30256 "lower" | 23051 "chamber" |
| 252633 " " | 57038 "used" | 30240 "were" | 22895 "amount" |
| 252149 "as" | 56516 "8" | 30234 "unit" | 22878 "along" |
| 249928 "an" | 55591 " " | 30158 "As" | 22799 "40" |
| 245314 "be" | 55381 "control" | 30128 ": " | 22794 "signals" |
| 222030 "or" | 55321 "other" | 29861 "weight" | 22669 "any" |
| 221291 "2" | 54118 ")," | 29597 "high" | 22592 "shaft" |
| 217955 "are" | 53475 "system" | 29352 "solution" | 22584 "25" |
| 215444 "sub" | 52791 "member" | 29253 "13" | 22517 "m" |
| 213312 "which" | 51396 "when" | 29082 "18" | 22483 "liquid" |
| 199602 "from" | 51229 "being" | 29022 "plate" | 22374 "voltage" |
| 191680 ")" | 51001 " " | 28341 "film" | 22067 "gas" |
| 177239 "at" | 50263 "data" | 28121 "e" | 21855 "part" |
| 169898 "3" | 49741 "will" | 28093 "use" | 21782 "CH" |
| 166467 "that" | 48944 "position" | 27925 "50" | 21647 "An" |
| 163327 " " | 48299 "material" | 27896 "step" | 21427 "type" |
| 156677 "4" | 47415 "R" | 27890 "It" | 21380 "obtained" |
| 154449 "FIG" | 46298 "20" | 27798 "provide" | 21361 " " |
| 149273 "on" | 44976 "according" | 27797 "S" | 21343 "fluid" |
| 129575 "0" | 44894 "device" | 27767 "operation" | 21328 "B" |
| 127461 "means" | 44565 "also" | 27700 "comprises" | 21322 "these" |
| 126797 "5" | 44561 "so" | 27693 "s" | 21233 "where" |
| 121294 "invention" | 44284 " " | 27471 "light" | 21090 "if" |
| 117996 "(" | 43248 "11" | 27374 "No" | 21058 "power" |
| 115844 "A" | 43124 "side" | 27340 "valve" | 21009 "_" |
| 102078 "first" | 43120 "g" | 27173 "22" | 20993 "outer" |
| 91538 "one" | 43115 "two" | 26983 "support" | 20963 "during" |
| 91459 "10" | 43045 "method" | 26979 "input" | 20949 " , " |
| 90199 "second" | 42938 "9" | 26960 "assembly" | 20948 "frame" |
| 89865 "can" | 42449 "circuit" | 26711 "thereof" | 20917 "substantially" |
| 89323 ")" | 41904 "than" | 26709 "plurality" | 20568 "only" |
| 85452 "such" | 41543 "layer" | 20512 "over" | 16934 "substrate" |
| 85063 "was" | 41448 "This" | 20070 "26" | 16829 "edge" |
| 82308 "In" | 41128 "embodiment" | 20013 "mounted" | 16799 "composition" |
| 81042 "wherein" | 40782 "output" | 19968 "contact" | 16714 "head" |
| 80064 "having" | 40573 "H" | 19808 "but" | 16600 "sheet" |
| 79474 "may" | 40231 "formed" | 19805 "structure" | 16536 "19" |
| 79043 "C" | 39790 "described" | 19750 "block" | 16512 "front" |
| 76154 ";" | 39650 "apparatus" | 19749 "another" | 16485 "heat" |
| 75848 "6" | 39611 "." | 19697 "17" | 16451 "art" |
| 75422 "this" | 39003 "pressure" | 19635 "added" | 16448 "magnetic" |
| 75012 ";" | 38813 "time" | 19614 "selected" | 16435 "respectively" |
| 74877 "each" | 38792 "temperature" | 19503 "object" | 16400 "parts" |
| 73608 "signal" | 38717 " ." | 19478 "under" | 16350 "accordance" |
| 73331 "claim" | 37938 "provided" | 19413 "current" | 16287 "N" |
| 73166 "present" | 37893 "14" | 19400 "optical" | 16190 "elements" |
| 37664 "et" | 26648 "flow" | 19381 "21" | 16123 "]" |
| 37649 "comprising" | 26480 "preferably" | 19380 "02" | 16112 "length" |
| 37644 "above" | 25719 "reaction" | 19378 "after" | 15988 "Date" |
| 37451 "example" | 25689 "OF" | 19329 "following" | 15980 "defined" |
| 37442 "al" | 25597 "value" | 19328 " " | 15891 "region" |
| 36890 "have" | 25444 "" " | 19315 "containing" | 15869 "compounds" |
| 36735 "then" | 25315 "upper" | 19289 "area" | 15849 "manner" |
| 36595 "acid" | 25164 "image" | 19158 "point" | 15843 "known" |
| 36571 "16" | 25079 "housing" | 19042 "product" | 15803 "formula" |
| 36531 "its" | 25044 "set" | 18966 "times" | 15759 "O" |
| 35566 "% " | 25032 "section" | 18954 "all" | 15743 "speed" |
| 35457 "line" | 24935 "##" | 18835 "32" | 15736 "=" |
| 35346 "view" | 24879 "--" | 18790 "generally" | 15709 "pair" |
| 35102 "least" | 24836 "air" | 18769 "corresponding" | 15605 "well" |
| 34385 "30" | 24634 ")." | 18518 "When" | 15590 "bottom" |
| 34193 "further" | 24575 "mixture" | 18504 "there" | 15543 "without" |
| 34182 "connected" | 24477 "using" | 18501 "top" | 15520 "J" |
| 34024 "group" | 24463 "FIGS" | 18417 "U" | 15468 "portions" |
| 33607 "more" | 24092 "reference" | 18380 "tube" | 15432 "information" |
| 33500 "form" | 24089 "THE" | 18363 "case" | 15349 "34" |
| 33207 " "" | 24043 "24" | 18293 "source" | 15306 "relative" |
| 33131 "within" | 23945 "made" | 18288 "both" | 15284 "If" |
| 33077 " " | 23944 "element" | 18263 "range" | 15264 "App" |
| 32222 "15" | 23766 "number" | 18213 "I" | 15249 "motor" |
| 31915 "includes" | 23506 "metal" | 18163 "applied" | 15178 "US" |
| 31804 "water" | 23493 "Number" | 18108 " " | 15172 "INVENTION" |
| 31755 ")." | 23410 "100" | 18095 "inner" | 15137 "thereby" |
| 31657 "process" | 23343 "out" | 18074 "28" | 15061 " ," |
| 31592 "been" | 23302 "including" | 18043 "i" | 15041 "spring" |
| 31241 "direction" | 23160 "base" | 18014 "axis" | 15035 "forming" |
| 31081 "body" | 23108 "wall" | 17726 "Example" | 14875 "like" |
| 30723 " " | 23106 "preferred" | 17725 "phase" | 14845 "thus" |

TABLE 1-continued

| | | | |
|---|---|---|---|
| 17581 "predetermined" | 14839 "switch" | 12241 "result" | 11049 "52" |
| 17446 "disposed" | 14761 "Class" | 12236 "vehicle" | 11046 "central" |
| 17368 "desired" | 14665 "up" | 11033 "test" | |
| 17354 "extending" | 14655 "'" | 11014 "respect" | |
| 17354 "60" | 14566 " " | 11010 "determined" | |
| 17349 "level" | 14530 "field" | 10956 "X" | |
| 17280 "while" | 14514 "processing" | 10940 "1989" | |
| 17196 "ml" | 14497 "ring" | 10931 "together" | |
| 17164 "low" | 14460 "no" | 10904 "arm" | |
| 17098 "drive" | 14403 "adjacent" | 10885 "n" | |
| 17078 "freguency" | 14378 "less" | 10867 "hydrogen" | |
| 17077 "opening" | 14371 "diameter" | 10834 "distance" | |
| 17006 "order" | 14326 "resin" | 10826 "they" | |
| 16973 "For" | 14304 "b" | 10771 "roller" | |
| 16966 "23" | 14236 "their" | 10724 "1991" | |
| 16964 "memory" | 14170 "addition" | 10711 "mounting" | |
| 16946 "different" | 14152 "polymer" | 10705 "greater" | |
| 14111 "those" | 12208 "mode" | 10702 "should" | |
| 14072 "conventional" | 12201 "38" | 10667 "conditions" | |
| 14067 "state" | 12149 "display" | 10625 "pin" | |
| 14016 "beam" | 12143 "cover" | 10622 "associated" | |
| 14008 "include" | 12116 "panel" | 10588 "open" | |
| 13980 "carbon" | 12110 "oil" | 10549 "engine" | |
| 13971 "cylinder" | 12085 "80" | 10538 "back" | |
| 13898 "Pat" | 12054 " " | 10536 "values" | |
| 13872 "electrode" | 12049 "angle" | 10532 "center" | |
| 13854 "upon" | 12017 "F" | 10529 "pump" | |
| 13850 "below" | 12014 "single" | 10524 "produced" | |
| 13849 "third" | 12013 "1990" | 10468 "After" | |
| 13751 "36" | 11963 "attached" | 10464 "results" | |
| 13712 "shows" | 11954 "transfer" | 10442 "09" | |
| 13687 "illustrated" | 11941 "mechanism" | 10439 "removed" | |
| 13626 "members" | 11872 "vertical" | 10413 "thickness" | |
| 13577 "sensor" | 11869 "function" | 10370 "now" | |
| 13499 "Refs" | 11869 "either" | 10370 "connection" | |
| 13484 "electrical" | 11842 "opposite" | 10327 "response" | |
| 13431 "force" | 11829 "01" | 10277 "fiber" | |
| 13430 "-" | 11806 "DESCRIPTION" | 10223 "large" | |
| 13409 "d" | 11766 "medium" | 10220 "sodium" | |
| 13363 "Thus" | 11737 "receiving" | 10212 "small" | |
| 13361 "cell" | 11688 "coupled" | 10204 "organic" | |
| 13344 "particular" | 11681 "JPX" | 10195 "carried" | |
| 13330 "filter" | 11638 "rotation" | 10183 "04" | |
| 13313 "alkyl" | 11638 "90" | 10162 "transmission" | |
| 13301 "42" | 11603 "However" | 10157 "per" | |
| 13262 "rate" | 11543 "Patent" | 10117 "c" | |
| 13255 " " | 11538 "positioned" | 10077 "E" | |
| 13239 "prepared" | 11537 "color" | 10045 "similar" | |
| 13235 "movement" | 11529 "surfaces" | 10037 "03" | |
| 13207 "located" | 11522 "mu" | | |
| 13180 "component" | 11513 "showing" | | |
| 13171 "application" | 11507 "rear" | | |
| 13160 "respective" | 11492 "supply" | | |
| 13135 "terminal" | 11453 "channel" | | |
| 13129 "EXAMPLE" | 11425 "groups" | | |
| 13056 "D" | 11418 "35" | | |
| 13047 "provides" | 11389 "arranged" | | |
| 12907 "prior" | 11383 "particles" | | |
| 12887 "suitable" | 11347 "claimed" | | |
| 12807 "M" | 11317 "required" | | |
| 12747 "Ex" | 11316 "These" | | |
| 12741 "main" | 11290 "machine" | | |
| 12737 "ends" | 11279 "V" | | |
| 12728 "against" | 11253 "27" | | |
| 12691 "materials" | 11226 "via" | | |
| 12649 "lines" | 11190 "cells" | | |
| 12628 "recording" | 11181 "solvent" | | |
| 12607 "possible" | 11162 "path" | | |
| 12604 "[" | 11149 "solid" | | |
| 12596 "guide" | 11141 "gate" | | |
| 12506 "size" | 11138 "hours" | | |
| 12488 "05" | 11119 "ratio" | | |
| 12486 "70" | 11117 "three" | | |
| 12434 "container" | 11108 "coating" | | |
| 12423 "parallel" | 11103 "rod" | | |
| 12407 "31" | 11080 "providing" | | |
| 12393 "components" | 11073 "44" | | |
| 12325 "various" | 11057 "fixed" | | |
| 12281 "particularly" | 11053 "would" | | |

What is claimed is:

1. Apparatus for compressing text comprising:

means for splitting a main character string into component strings;

means for counting the frequency of occurrence of each component string in the main character string and ordering the component strings in their frequency of occurrence;

first allocating means for allocating to each component string a token value representative of the component string and determined by the frequency of occurrence of the component string;

means for storing the token value so allocated as a token table;

second allocating means for allocating to each component string in the main character string the token value for that component string from the token table to generate a sequence of token values representing the main character string in a compressed format; and means for storing the sequence of token values, wherein the splitting means in operation splits the main character string in accordance with a splitting algorithm into first and second sets of component strings, the first set comprising strings of multiple spaces and the second set comprising the remainder of the main character string which comprises non-multiple spaced strings which include words, single spaces and punctuation so that tokens representing single spaces are discarded, the second allocating means tokenises each combination, in the text, of a single space and a punctuation mark as a component string, and wherein the splitting algorithm and the second allocating means thereby enable the original document to be reconstituted faithfully including the single spaces which have effectively been discarded in the splitting process.

2. Apparatus according to claim 1, further comprising means for generating a first level index file whereby identifiers identifying individual documents which together constitute the main character string are listed.

3. Apparatus according to claim 2, wherein in the first level index file along with an identifier for each document the start position of the document and an indication of the end of the document is stored.

4. Apparatus according to claim 3, wherein the end position of each document is indicated by storing in the index file a value indicative of the length of the document.

5. Apparatus according to claim 2, further comprising means for generating second level index files each representative of a field to be searched when a user wishes to access the compressed data.

6. Database apparatus comprising an apparatus as claimed in claim 1 and further including means for decompressing the main character string so as to faithfully reconstruct the compressed text.

7. A method for compressing text comprising the steps of:
splitting a main character string into component strings;
counting the frequency of occurrence of each component string in the main character string and ordering the component strings in their frequency of occurrence;
a first allocating step of allocating to each component string a token value representative of the component string and determined by the frequency of occurrence of the component string;
storing the token value so allocated as a token table in which tokens are associated with component strings;
a second allocating step of allocating to each component string in the main character string the token value for that component string from the token table to generate a sequence of token values representing the main character string in a compressed format; and
storing the sequence of token values,
wherein the splitting splits the main character string in accordance with a splitting algorithm into first and second sets of component strings, the first set comprising strings of multiple spaces and the second set comprising the remainder of the main character string which comprises non-multiple spaced strings which include words, single spaces and punctuation so that tokens representing single spaces are discarded, the second allocating step tokenises each combination, in the text, of a single space and a punctuation mark as a component string, and wherein the splitting algorithm and the second allocating step thereby enable the original document to be reconstituted faithfully including the single spaces which have effectively been discarded in the splitting process.

8. A method according to claim 7, further comprising the step for generating a first level index file whereby identifiers identifying individual documents which together constitute the main character string are listed.

9. A method according to claim 8, wherein in the first level index file along with an identifier for each document the start position of the document and an indication of the end of the document is stored.

10. A method according to claim 9, wherein the end position of each document is indicated by storing in the index file a value indicative of the length of the document.

11. A method according to claim 8, further comprising the step for generating second level index files each representative of a field to be searched when a user wishes to access the compressed data.

12. Apparatus for decompressing a sequence of tokens generated by the method of claim 7, comprising means for reading said token table and means for allocating to each token in the sequence of tokens read the character string represented by the token so as to reconstitute the main character string, and means for reconstituting the discarded single spaces by logical operations on the remaining token values, wherein said means for reconstituting operates as follows for reconstituting the discarded spaces: if the last character of the previously output component string is not a space or punctuation mark and the first character of the current component string is not a space or a punctuation mark then a space is output followed by the component string or else the component string is output alone.

13. Apparatus according to claim 12, further comprising means for accessing one or more index files defining fields within the main character string.

14. A method of decompressing text compressed by the method as claimed in claim 7, comprising reading said token table, allocating to each token in the sequence of tokens read the character string represented by the token so as to reconstitute the main character string, and reconstituting the discarded single spaces by logical operations on the remaining token values, wherein the single spaces are reconstituted by using an algorithm which operates as follows: if the last character of the previously output component string is not a space or punctuation mark and the first character of the current component string is not a space or a punctuation mark then a space is output followed by the component string or else the component string is output alone.

15. A method according to claim 14, further comprising reading first and second level index files so that a selected portion of the text alone can be reconstituted.

16. A compressed data signal comprising a sequence of tokens when generated by the method of claim 7.

17. A data storage medium when storing a sequence of tokens representing the token table and generated by the method of claim 7.

18. A computer usable medium having computer readable instructions stored therein for causing a processor in a computer apparatus to carry out the following operations in order to compress text as expressed by a main character string:
splitting the main character string into component strings, wherein the splitting operation splits the main character string in two stages, wherein in a first stage the main character string is split into strings of multiple spaces which represent part of the final component strings and strings which include single spaces, words and punctuation, and in a second stage the non-multiple space strings are split in accordance with a splitting algorithm into words, punctuation and single spaces which represent the remainder of the component strings;
counting the frequency of occurrence of each component string in the main character string and ordering the component strings in their frequency of occurrence;

a first allocating step of allocating to each component string apart from single spaces a token value representative of the component string and determined by the frequency of occurrence of the component string;

a second allocating step of allocating to each component string in the main character string the token value for that component string from the token table to generate a sequence of token values representing the main character string in a compressed format, wherein the second allocating step tokenises each combination, in the text, of a single space and a punctuation mark as a component string; and storing the sequence of token values, wherein said splitting algorithm and the second allocating step enable the original document to be reconstituted faithfully including the single spaces which have effectively been discarded.

* * * * *

UNITED STATES PATENT AND TRADEMARK OFFICE
CERTIFICATE OF CORRECTION

| | |
|---|---|
| PATENT NO. | : 6,304,601 B1 |
| APPLICATION NO. | : 09/043584 |
| DATED | : October 16, 2001 |
| INVENTOR(S) | : Allan Joseph Davison |

Page 1 of 1

It is certified that error appears in the above-identified patent and that said Letters Patent is hereby corrected as shown below:

COVER [73] Assignee

"Canon Research Centre Europe Ltd. (GB)" should read --Canon Research Centre Europe Ltd., Guilford (GB)--.

COLUMN 5

Line 31, "components" should read --component--.

COLUMN 7

Line 42, "un" should read --u--.

COLUMN 13

Line 12, "17078 "freguency"" should read --17078 frequency--.

COLUMN 16

Line 45, "when" should be deleted.

Signed and Sealed this

Nineteenth Day of February, 2008

JON W. DUDAS
*Director of the United States Patent and Trademark Office*